United States Patent
Dang et al.

(10) Patent No.: US 9,577,191 B2
(45) Date of Patent: Feb. 21, 2017

(54) RRAM CELL BOTTOM ELECTRODE FORMATION

(71) Applicant: Taiwan Semiconductor Manufacturing Co., Ltd., Hsin-Chu (TW)

(72) Inventors: Trinh Hai Dang, Hsinchu (TW);
Hsing-Lien Lin, Hsin-Chu (TW);
Kai-Wen Cheng, Taichung (TW);
Cheng-Yuan Tsai, Chu-Pei (TW);
Chia-Shiung Tsai, Hsin-Chu (TW);
Ru-Liang Lee, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 331 days.

(21) Appl. No.: 14/242,983

(22) Filed: Apr. 2, 2014

(65) Prior Publication Data

US 2015/0287918 A1      Oct. 8, 2015

(51) Int. Cl.
*H01L 27/24* (2006.01)
*H01L 45/00* (2006.01)

(52) U.S. Cl.
CPC ........... *H01L 45/1616* (2013.01); *H01L 45/08* (2013.01); *H01L 45/1233* (2013.01);
(Continued)

(58) Field of Classification Search
CPC ... H05B 3/00; G11C 13/0002; G11C 13/0014; H01L 27/24
See application file for complete search history.

(56) References Cited

U.S. PATENT DOCUMENTS 8,350,247 B2   1/2013   Lee et al.
8,598,560 B1   12/2013   Milojevic et al.
(Continued)

FOREIGN PATENT DOCUMENTS

KR   20120004827 A   1/2012

OTHER PUBLICATIONS

Ducan, Dan. "Abstract Submitted for the MAR14 Meeting of the American Physical Society." Stanford University. Nov. 15, 2013.
(Continued)

*Primary Examiner* — Mohammad Choudhry
(74) *Attorney, Agent, or Firm* — Eschweiler & Associates, LLC

(57) ABSTRACT

The present disclosure relates to a method of forming a resistive random access memory (RRAM) cell having a reduced leakage current, and an associated apparatus. In some embodiments, the method is performed by forming a bottom electrode over a lower metal interconnect layer using an atomic layer deposition (ALD) process to form at least a top portion of the bottom electrode. A dielectric data storage layer is formed onto the top portion of the bottom electrode in-situ with forming the top portion of the bottom electrode. A top electrode is formed over the dielectric data storage layer, and an upper metal interconnect layer is formed over the top electrode. By forming the top portion of the bottom electrode using an ALD process that is in-situ with the formation of the overlying dielectric data storage layer, leakage current, leakage current distribution and device yield of the RRAM cell are improved.

20 Claims, 6 Drawing Sheets

(52) U.S. Cl.
CPC ........ *H01L 45/1253* (2013.01); *H01L 45/146* (2013.01); *H01L 45/16* (2013.01); *H01L 45/1675* (2013.01)

(56) References Cited

U.S. PATENT DOCUMENTS

| | | |
|---|---|---|
| 2010/0051896 A1 | 3/2010 | Park et al. |
| 2011/0175050 A1 | 7/2011 | Chien et al. |
| 2011/0248236 A1 | 10/2011 | Kim et al. |
| 2011/0286275 A1 | 11/2011 | Jeon et al. |
| 2012/0063201 A1 | 3/2012 | Hayakawa et al. |
| 2014/0117303 A1* | 5/2014 | Wang .................. H01L 45/145 257/4 |

OTHER PUBLICATIONS

U.S. Appl. No. 14/592,340, filed Jan. 8, 2015.
Wu, et al. "Investigation of ALD or PVD (Ti-rich vs. N-rich) TiN Metal Gate Thermal Stability on HfO2 High-K." International Symposium on VLSI Technology Systems and Applications (VLSI-TSA), 2010. Apr. 26-28, 2010.
Non Final Office Action Dated Oct. 27, 2016 U.S. Appl. No. 14/592,340.

\* cited by examiner

RRAM CELL BOTTOM ELECTRODE FORMATION

BACKGROUND

Many modern day electronic devices contain electronic memory configured to store data. Electronic memory may be volatile memory or non-volatile memory. Volatile memory stores data while it is powered, while non-volatile memory is able to store data when power is removed. Resistive random access memory (RRAM) is one promising candidate for next generation non-volatile memory technology due to its simple structure and its compatibility with CMOS logic fabrication processes. An RRAM cell includes a resistive data storage layer vertically located between two electrodes disposed within back-end-of-the-line (BEOL) metallization layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
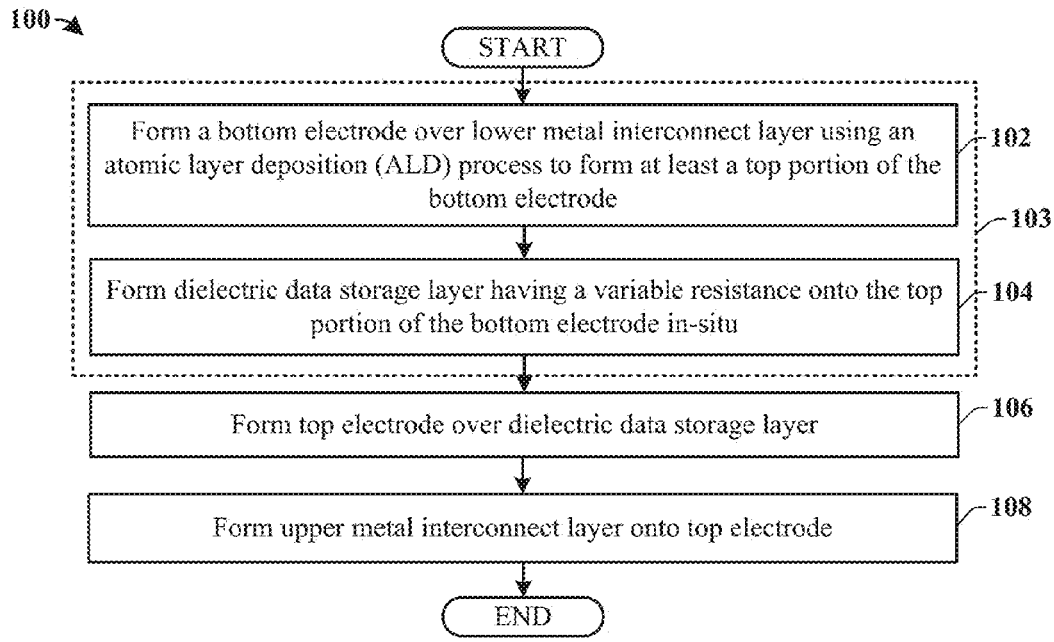
FIG. 1 illustrates a flow diagram of some embodiments of a method of forming a resistive random access memory (RRAM) cell using an atomic layer deposition (ALD) process to form a bottom electrode and an in-situ deposition process to form an overlying dielectric data storage layer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Resistive random access memory (RRAM) cells have a bottom electrode that is separated from an overlying top electrode by a dielectric data storage layer. The bottom electrode is typically deposited over a substrate using a physical vapor deposition (PVD) technique. The dielectric data storage layer is then formed ex-situ over the bottom electrode. However, it has been appreciated that bottom electrodes (e.g., TiN) formed using a PVD process scavenge oxygen that diffuses from the high-k dielectric layer towards the bottom electrode. The oxygen degrades the interface between the bottom electrode and the dielectric data storage layer, giving the RRAM cell a high leakage current that can result in low device yield (e.g., due to increasing leakage current near the edge of a wafer).

Accordingly, the present disclosure relates to a method of forming a resistive random access memory (RRAM) cell having a reduced leakage current, and an associated apparatus. In some embodiments, the method comprises forming a bottom electrode over a lower metal interconnect layer using an atomic layer deposition (ALD) process that forms at least a top portion of the bottom electrode. A dielectric data storage layer is formed onto the top portion of the bottom electrode in-situ with the formation of the top portion of the bottom electrode. A top electrode is then formed over the dielectric data storage layer, and an upper metal interconnect layer is formed over the top electrode. By forming the top portion of the bottom electrode using an ALD process that is in-situ with the formation of the overlying dielectric data storage layer, interfacial properties between the bottom electrode and the dielectric data storage layer are improved causing a reduction in the leakage current, leakage current distribution, and device yield of the RRAM cell.

FIG. 1 illustrates some embodiments of a method 100 of forming a resistive random access memory (RRAM) cell having a low leakage current, using an ALD process to form a bottom electrode and an in-situ ALD process to form an overlying dielectric data storage layer.

At 102, a bottom electrode is formed over a lower metal interconnect layer using an atomic layer deposition (ALD) process to form at least a top portion of the bottom electrode. The ALD process may comprise any type of atomic layer deposition process, including but not limited to ALD or plasma enhanced ALD (PEALD). The use of an ALD process to form the top portion of the bottom electrode can suppress the out-diffusion of oxygen into the bottom electrode, thereby improving the integrity of the interface between the bottom electrode and an overlying dielectric data storage layer.

At 104, a dielectric data storage layer having a variable resistance is formed onto the top portion of the bottom electrode in-situ with the formation of the bottom electrode. The in-situ formation of the dielectric data storage layer and the bottom electrode, illustrated by box 103, prevents the formation of an oxide interface layer (that can degrade the electrical performance of the RRAM cell) on the bottom electrode layer. In some embodiments, the dielectric data storage layer may be formed by way of an ALD process. In other embodiments, the dielectric data storage layer may be formed by other deposition techniques.

At 106, a top electrode is formed over the dielectric data storage layer.

At 108, an upper metal interconnect layer is formed over the top electrode. In some embodiments, the upper metal interconnect layer may comprise an upper metal via layer formed onto the top electrode. In other embodiments, the upper metal interconnect layer may further comprise an upper metal wire layer disposed onto the upper metal via layer.

Figure 2:
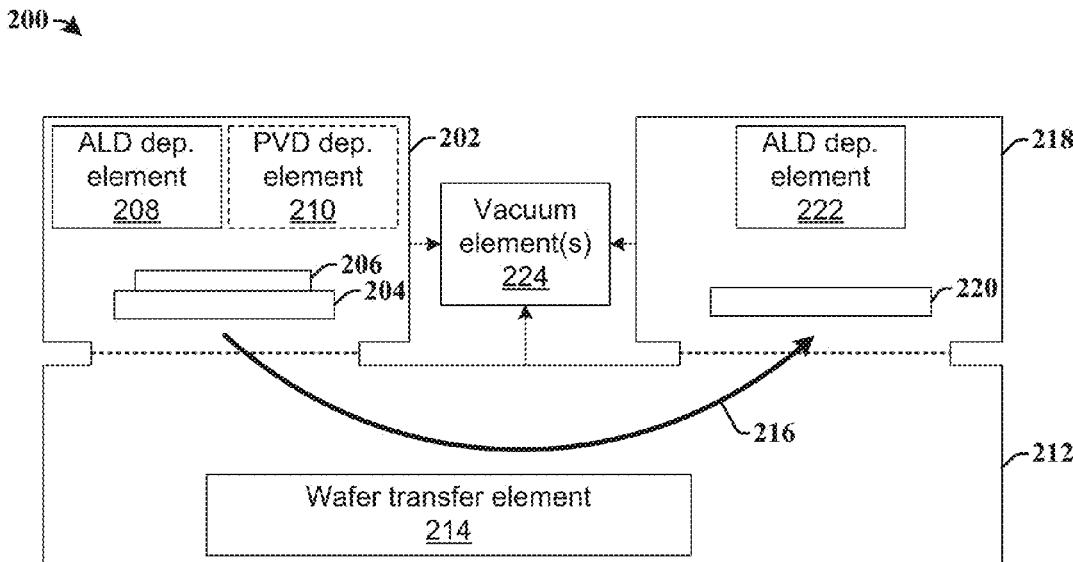
FIG. 2 illustrates a block diagram of some embodiments of a processing tool configured to perform in-situ a first ALD process to form a bottom electrode and a second ALD process to form an overlying dielectric data storage layer.

FIG. 2 illustrates a block diagram of some embodiments of a processing tool 200 configured to perform in-situ an ALD process to form a bottom electrode and an ALD process to form an overlying dielectric data storage layer for an RRAM cell.

The processing tool 200 comprises a first processing chamber 202 connected to a second processing chamber 218 by way of a wafer transfer chamber 212. The first processing chamber 202, the second processing chamber 218, and the wafer transfer chamber 212 are connected to one or more vacuum elements 224 (e.g., vacuum pumps), which are configured to generate a low pressure ambient within the first processing chamber 202, the second processing chamber 218, and the wafer transfer chamber 212. In some embodiments, the low pressure ambient may have a pressure in a range of between approximately $10^{-3}$ torr and approximately $10^{-5}$ torr, for example.

The first processing chamber 202 comprises first a wafer support element 204 (e.g., an electrostatic wafer chuck) configured to hold a semiconductor substrate 206 upon which an RRAM cell is to be formed. The first processing chamber 202 further comprises an ALD deposition element 208 configured to deposit at least a top portion of a bottom electrode of an RRAM cell by way of an ALD process. In some embodiments, the ALD deposition element 208 may be configured to deposit the entire bottom electrode. The ALD deposition element 208 may comprise gas inlets configured to introduce gas phase precursors (e.g., $TiCl_4$ and $NH_3$ or $N_2/H_2$ precursors to form TiN) into the first processing chamber 202 one at a time and a purge element configured to purge the gas phase precursors. During each growth cycle, precursor molecules of a gas phase precursor react with the molecules on the semiconductor substrate 206 to form an atomic layer. In some embodiments, the ALD deposition element 208 may comprise a plasma enhanced ALD element further comprising an RF plasma generation element configured to generate a plasma that improves deposition rates within the first processing chamber 202.

In some embodiments, the first processing chamber 202 may further comprise a PVD deposition element 210 configured to deposit a bottom portion of the bottom electrode of the RRAM cell by way of a physical vapor deposition (PVD) process. In such embodiments, the PVD deposition element 210 is configured to form the bottom portion of the bottom electrode, while the ALD deposition element 208 is configured to form the top portion of the bottom electrode onto the bottom portion of the bottom electrode.

The wafer transfer chamber 212 is in communication with the first processing chamber 202 and comprises a wafer transfer element 214 (e.g., a wafer transfer robot). The wafer transfer element 214 is configured to move the semiconductor substrate 206 from the first processing chamber 202 to the second processing chamber 218. Since the wafer transfer chamber 212 is held under vacuum, the wafer transfer element 214 is able to transfer the semiconductor substrate 206 to the second processing chamber 218 in-situ (i.e., without breaking the low pressure ambient).

The second processing chamber 218 comprises a second wafer support element 220 configured to hold the semiconductor substrate 206. The second processing chamber also comprises an ALD deposition element 222 configured to deposit a dielectric data storage layer onto the portion of the bottom electrode by way of an ALD process (e.g., using $HfCl_4$ and $H_2O$ precursors to form a dielectric data storage layer comprising $HfO_x$).

Figure 3A:
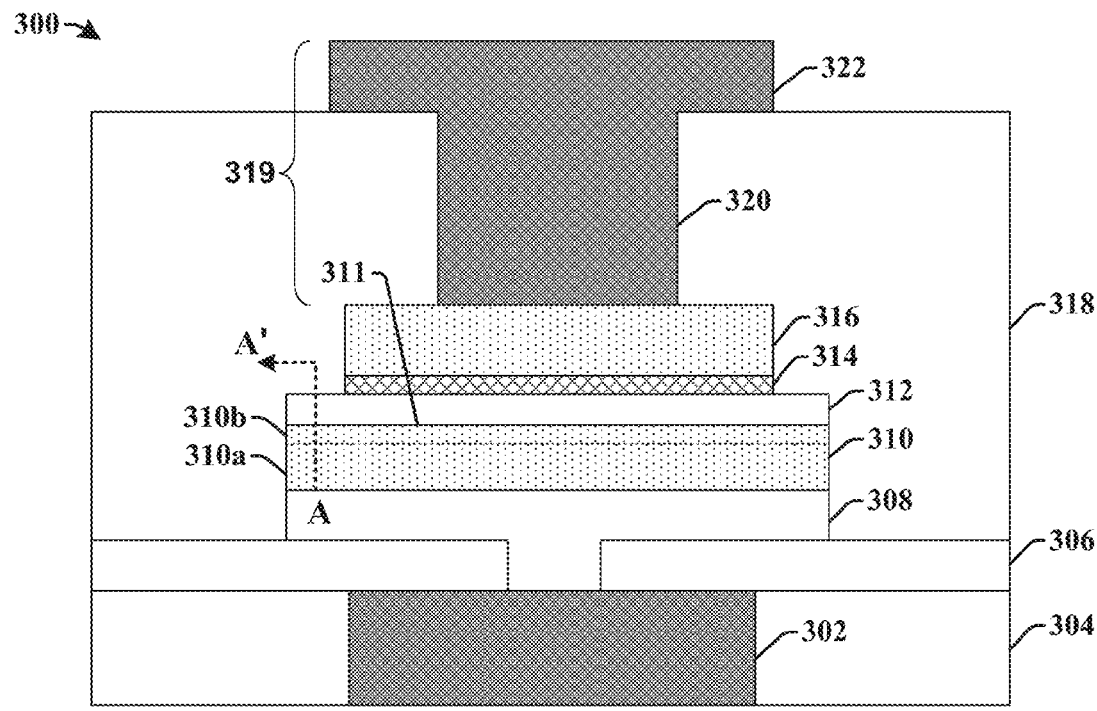
FIG. 3A illustrates a cross-sectional view of some embodiments of RRAM cell having a bottom electrode deposited by an ALD process and an overlying in-situ dielectric data storage layer.

FIG. 3A illustrates a cross-sectional view of an RRAM cell 300 having a bottom electrode 310 formed by an ALD process.

The RRAM cell 300 comprises a diffusion barrier layer 308 disposed onto a bottom dielectric layer 306 and a lower metal interconnect layer 302, which is surrounded by an inter-level dielectric (ILD) layer 304 within a BEOL (back-end-of-the-line) metallization stack. In some embodiments, the lower metal interconnect layer 302 may comprise one of a plurality of metal interconnect layers disposed between the diffusion barrier layer 308 and an underlying semiconductor substrate (not shown). A bottom electrode 310 is disposed onto the diffusion barrier layer 308. The diffusion barrier layer 308 is configured to prevent material from the lower metal interconnect layer 302 from diffusing to the bottom electrode 310.

The bottom electrode 310 has a top surface 311 that has been formed by an ALD process. For example, in some embodiments the bottom electrode 310 may be formed by a continuous ALD process. In other embodiments, the bottom electrode 310 may be formed by a two-phase deposition process in which a bottom portion of the bottom electrode 310a is formed by a PVD process while a top portion of the bottom electrode 310b is formed by an ALD process. In some embodiments, the bottom portion of the bottom electrode 310a may have a larger thickness than the top portion of the bottom electrode 310b.

An in-situ dielectric data storage layer 312 (i.e., a dielectric data storage layer that has been formed in-situ with the underlying bottom electrode layer 310) is disposed onto the top surface 311 of the bottom electrode 310, such that the dielectric data storage layer 312 is in direct contact with the top surface 311 of the bottom electrode 310 formed by the ALD process. The in-situ dielectric data storage layer 312 comprises a variable resistance metal oxide layer that is configured to store a data state. For example, a voltage applied to the in-situ dielectric data storage layer 312 will induce conductive paths (e.g., oxygen vacancies) to form across the dielectric data storage layer 312, thereby reducing the resistance of the in-situ dielectric data storage layer 312. Depending on an applied voltage, the in-situ dielectric data storage layer 312 will undergo a reversible change between a high resistance state and a low resistance state.

Because the in-situ dielectric data storage layer 312 is formed in-situ with the bottom electrode 310, the in-situ dielectric data storage layer 312 directly abuts the bottom electrode 310 without an intervening oxide interface layer that will form when the in-situ dielectric data storage layer 312 is formed ex-situ with the bottom electrode 310. Furthermore, it has been appreciated that the use of an ALD process to form the bottom electrode 310 results in a bottom electrode 310 having a lower $O_2$ concentration than that of a bottom electrode 310 formed using a physical vapor deposition (PVD) process.

Figure 3B:
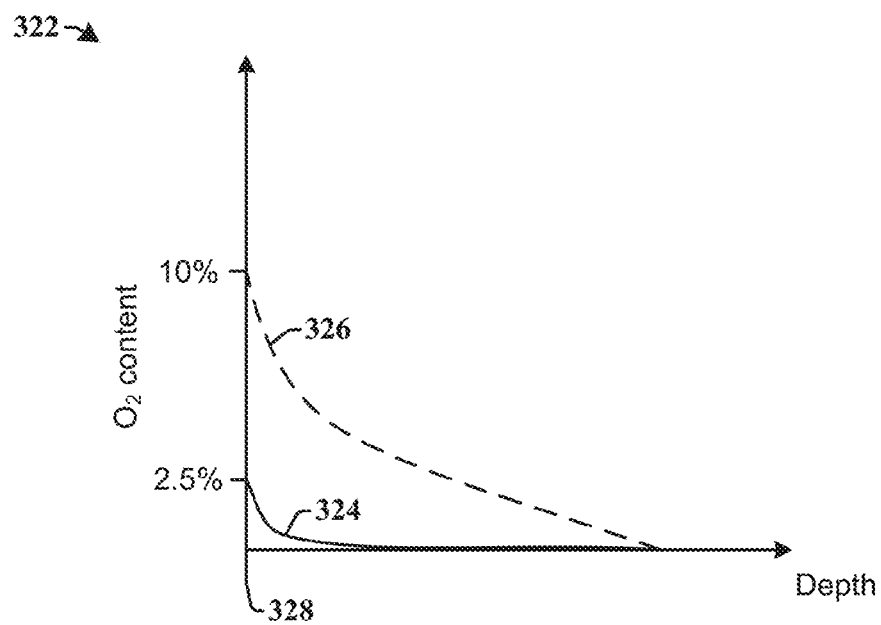
FIG. 3B illustrates a graph showing some embodiments of an exemplary XPS depth profile of the bottom electrode and the in-situ dielectric data storage layer of an RRAM cell.

For example, FIG. 3B illustrates some embodiments of a graph 322 showing an exemplary x-ray photoelectron spectroscopy (XPS) depth profile 324 showing the oxygen content of bottom electrode 310 (along cross-sectional line A-A'). Graph 322 further illustrates an XPS depth profile 326 showing the oxygen content of a bottom electrode formed using a PVD process.

As shown in XPS depth profile 324, the oxygen content of bottom electrode 310 increases with a relatively small slope until a position close to an interface 328 between the bottom electrode 310 and the overlying dielectric data storage layer 312. The XPS depth profile 324 reaches a maximum oxygen content of approximately 2.5% at the interface 328. XPS depth profile 326 shows that the oxygen content of a bottom electrode formed using a PVD process increases with a substantially larger slope and reaches a maximum oxygen content of approximately 10% at the interface 328.

Referring again to FIG. 3A, in some embodiments, a capping layer 314 may be disposed over the dielectric data storage layer 312. The capping layer 314 is configured to store oxygen, which can facilitate resistance changes within the dielectric data storage layer 312. In some embodiments, the capping layer 314 may comprise a metal or a metal oxide that is relatively low in oxygen concentration. A top electrode 316 is disposed over the capping layer 314, and an upper metal interconnect layer 319 is disposed over the top electrode 316. In some embodiments, the upper metal interconnect layer 319 may comprise an upper metal via layer 320 and an upper metal wire layer 322 comprising a conductive material (e.g., copper, aluminum, etc.).

Figure 4:
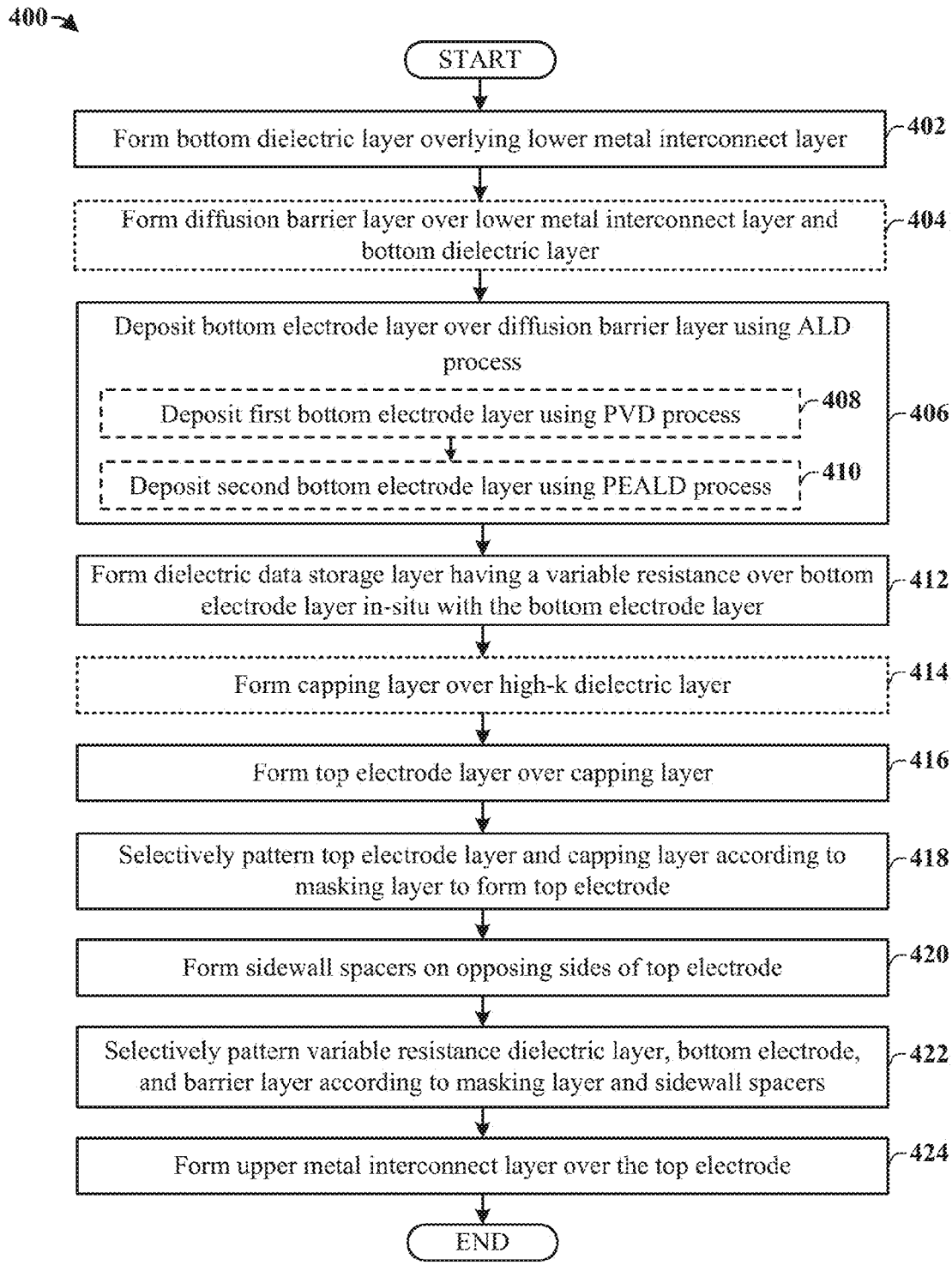
FIG. 4 illustrates a flow diagram of some additional embodiments of a method of forming a RRAM cell using an ALD process to form a bottom electrode and an in-situ deposition process to form an overlying dielectric data storage layer.

FIG. 4 illustrates some additional embodiments of a method 400 of forming an RRAM cell using an ALD process to form a bottom electrode and an in-situ ALD process to form an overlying dielectric data storage layer.

While disclosed methods (e.g., methods 100 and 400) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases At 402, a bottom dielectric layer is formed over a lower metal interconnect layer. The bottom dielectric layer has an opening that exposes the lower metal interconnect layer.

At 404, a diffusion barrier layer may be formed over the lower metal interconnect layer and the bottom dielectric layer, in some embodiments. The diffusion barrier layer may be deposited into an opening in a bottom dielectric that exposes an underlying metal interconnect layer, so that the diffusion barrier layer abuts the underlying metal layer.

At 406, a bottom electrode layer is formed over the diffusion barrier layer using an ALD process. In some embodiments, the bottom electrode layer may be formed by depositing a first bottom electrode layer onto the diffusion barrier layer using a PVD process, at 408. A second bottom electrode layer may be subsequently formed onto and in direct contact with the first bottom electrode layer using an ALD process, at 410.

At 412, a dielectric data storage layer is formed over bottom electrode layer in-situ with the formation of the bottom electrode layer. The dielectric data storage layer has a variable resistance that is configured to undergo a reversible change between a high resistance state and a low resistance state depending on a voltage applied to the bottom electrode or the top electrode. In some embodiments, the dielectric data storage layer may comprise a high-k dielectric layer.

At 414, a capping layer may be formed over the dielectric data storage layer, in some embodiments.

At 416, a top electrode layer is formed over the capping layer.

At 418, the top electrode layer and the capping layer are selectively patterned according to a masking layer. Selective patterning of the top electrode layer forms the top electrode of the RRAM cell.

At 420, sidewall spacers are formed on opposing sides of the top electrode and the capping layer.

At 422, the dielectric data storage layer, the bottom electrode layer, and the diffusion barrier layer are selectively patterned according to the masking layer and the sidewall spacers. Selective patterning of the bottom electrode layer forms the bottom electrode of the RRAM cell At 424, an upper metal interconnect layer is formed over the top electrode. In some embodiments, the upper metal interconnect layer may comprise an upper metal via layer formed onto the top electrode and an upper metal wire layer formed onto the upper metal via layer.

FIGS. 5-13 illustrate some embodiments of cross-sectional views showing a method of forming an RRAM cell using an ALD process to form a bottom electrode and an in-situ ALD process to form an overlying dielectric data storage layer. Although FIGS. 5-13 are described in relation to method 400, it will be appreciated that the structures disclosed in FIGS. 5-13 are not limited to such a method, but instead may stand alone as structures independent of the method.

Figure 5:
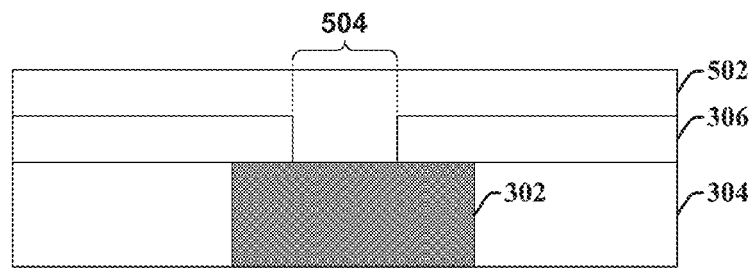
FIGS. 5-12 illustrate some embodiments of cross-sectional views showing a method of forming an RRAM cell using an ALD process to form a bottom electrode and an in-situ ALD process to form an overlying high-k dielectric material.

FIG. 5 illustrates some embodiments of a cross-sectional view 500 corresponding to acts 402-404.

As shown in cross-sectional view 500, a bottom dielectric layer 306 is formed at a position overlying a lower metal interconnect layer 302 disposed within an inter-level dielectric (ILD) layer 304. The bottom dielectric layer 306 comprises an opening 504 that exposes the lower metal interconnect layer 302. A diffusion barrier layer 502 may be deposited within the opening 504 and over the bottom dielectric layer 306 using a deposition technique (e.g., chemical vapor deposition, physical vapor deposition, etc.).

In some embodiments, the lower metal interconnect layer 302 may comprise a conductive metal such as copper or aluminum. In some embodiments, the ILD layer 304 may comprise an oxide, a low-k dielectric, or an ultra low-k dielectric. In some embodiments, the bottom dielectric layer 306 may comprise silicon carbide (SiC) or silicon nitride (SiN), for example. In some embodiments, the diffusion barrier layer 502 may comprise is a conductive oxide, nitride, or oxynitride of a metal such as aluminum (Al), magnesium (Mn), cobalt (Co), titanium (Ti), tantalum (Ta), tungsten (W), nickel (Ni), Tin (Sn), magnesium (Mg), etc.

Figures 6A, 6B:
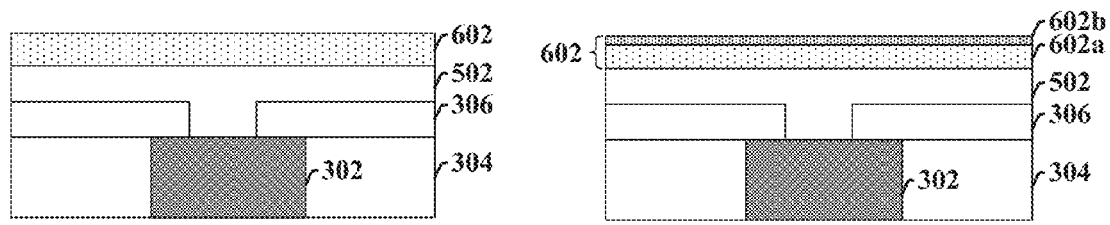

FIGS. 6A-6B illustrate some embodiments of cross-sectional views, 600 and 604, corresponding to act 406.

FIG. 6A illustrates a cross-sectional view 600 in which the bottom electrode layer 602 is formed using a continuous ALD deposition process. The bottom electrode layer 602 may be formed onto the diffusion barrier layer 502. In some embodiments, the ALD process may comprise a plasma enhanced ALD (PEALD) process, which makes use of an RF-plasma to enable higher deposition rates (i.e., higher throughput) and improved film electrical properties at lower temperatures when compared to conventional ALD processes. In various embodiments, the bottom electrode layer 602 may comprise a metal nitride or a metal. For example, in some embodiments, the bottom electrode layer 602 may comprise titanium nitride (TiN) or tantalum nitride (TaN). In other embodiments, the bottom electrode layer 602 may comprise tungsten (W) or copper (Cu).

FIG. 6B illustrates a cross-sectional view 604 in which a bottom electrode layer 602 is formed using a two-phase deposition process that deposits a first bottom electrode layer 602a using a physical vapor deposition (PVD) process and a second bottom electrode layer 602b using a subsequent ALD process. In some embodiments, the first bottom electrode layer 602a may be formed to a first thickness using the PVD process. The second bottom electrode layer 602b may be subsequently formed onto the first bottom electrode layer 602a to a second thickness, which is less than the first thickness, using an ALD process.

The use of the two-phase deposition process to form the bottom electrode layer 602 improves the through-put of method 400, while still providing for a top surface that can provide for an RRAM with improved electrical characteristics. This is because the PVD process provides for a high deposition rate, while the ALD process provides for a top surface that suppresses the out-diffusion of oxygen into the bottom electrode layer 602. In some embodiments, the first bottom electrode layer 602a may be formed to a first thickness having a range of between approximately 50 angstroms and approximately 100 angstroms, while the second bottom electrode layer 602b may be formed to a second thickness having a range of between approximately 15 angstroms and approximately 30 angstroms. Such a second thickness is sufficient to allow for the suppression the out-diffusion of oxygen in the bottom electrode layer 602.

Figure 7:
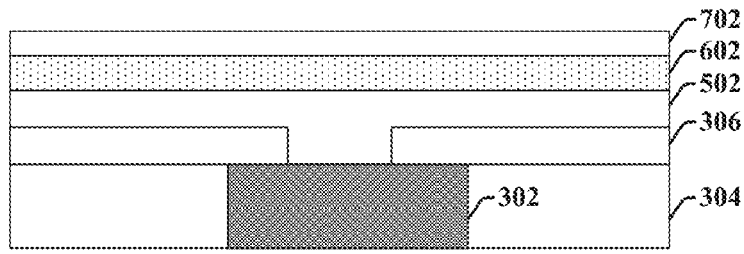

FIG. 7 illustrates some embodiments of a cross-sectional view 700 corresponding to act 412.

As shown in cross-sectional view 700, a dielectric data storage layer 702 having a variable resistance is formed over the bottom electrode layer 602, in-situ (e.g., without removing the substrate from vacuum) with the bottom electrode layer 602. Forming the dielectric data storage layer 702 over the bottom electrode layer 602 deposited by an ALD process improves electrical properties of the RRAM device (e.g., reduces leakage currents). For example, a titanium nitride (TiN) bottom electrode layer deposited by an ALD process has a smaller oxygen concentration gradient than a TiN bottom electrode layer deposited by a PVD process. Therefore, the TiN bottom electrode layer deposited by an ALD process can suppress the out-diffusion of oxygen into the TiN bottom electrode layer, providing for a better interface integrity at an interface between the TiN bottom electrode layer and the dielectric data storage layer. Furthermore, the in-situ formation of the bottom electrode layer 602 and the dielectric data storage layer 702 prevents the formation of an oxide interface layer, which can degrade the electrical performance of RRAM cells (e.g., increase the leakage current of an RRAM cell).

In some embodiments, the dielectric data storage layer 702 may be deposited by way of an ALD process. The ALD process provides for good step coverage that improves the interface between the bottom electrode layer 602 and the dielectric data storage layer 702. In some embodiments, the dielectric data storage layer 702 may comprise a high-k dielectric material. For example, in various embodiments, the dielectric data storage layer 702 may comprise hafnium oxide ($HfO_x$), zirconium oxide ($ZrO_x$), aluminum oxide ($AlO_x$), nickel oxide ($NiO_x$), tantalum oxide ($TaO_x$), or titanium oxide ($TiO_x$).

Figure 8:
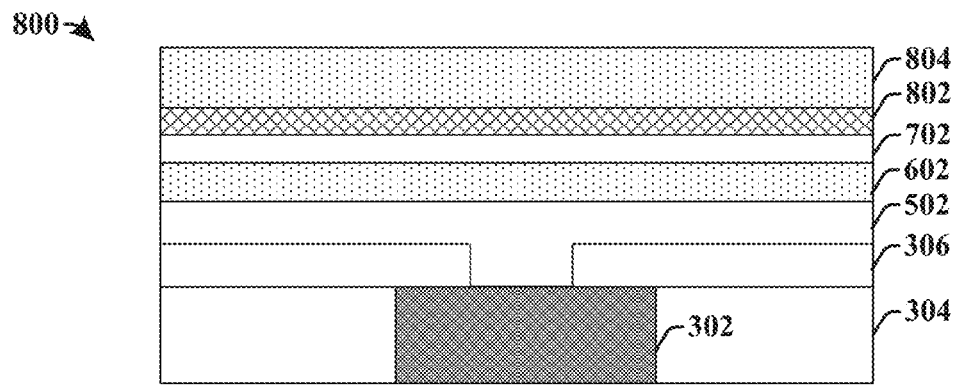

FIG. 8 illustrates some embodiments of a cross-sectional view 800 corresponding to acts 414-416.

As shown in cross-sectional view 800, a capping layer 802 may be formed onto the dielectric data storage layer 702. In some embodiments, the capping layer 802 may comprise a metal such as titanium (Ti), hafnium (Hf), platinum (Pt), and/or aluminum (Al). In other embodiments, the capping layer 802 may comprise a metal oxide such as titanium oxide ($TiO_x$), hafnium oxide ($HfO_x$), zirconium oxide ($ZrO_x$), germanium oxide ($GeO_x$), cesium oxide ($CeO_x$)

A top electrode layer 804 is formed over the capping layer 802. The top electrode layer 804 may be deposited by way of a vapor deposition technique (e.g., physical vapor deposition, chemical vapor deposition, etc.). In various embodiments, the top electrode layer 804 may comprise a metal nitride or a metal. For example, in some embodiments, the top electrode layer 804 may comprise titanium nitride (TiN) or tantalum nitride (TaN). In other embodiments, the top electrode layer 804 may comprise tungsten (W) or copper (Cu).

Figure 9:
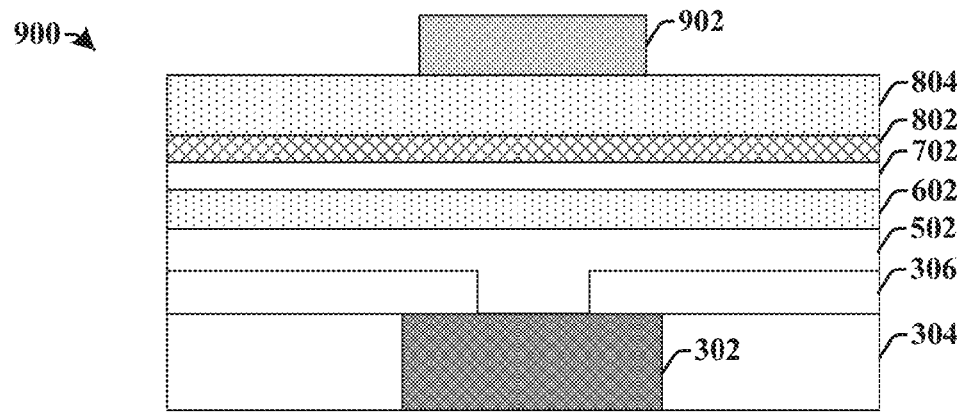

FIG. 9 illustrates some embodiments of a cross-sectional view 900 corresponding to act 418.

As shown in cross-sectional view 900, a masking layer 902 is selectively formed over the top electrode layer 804. The masking layer 902 is configured to define a top electrode of the RRAM cell. In some embodiments, the masking layer 902 may comprise a hard mask layer. For example, the masking layer 902 may comprise a hard mask material, such as silicon-oxide ($SiO_2$), silicon-nitride (SiN), silicon-oxynitride (SiON), or silicon-carbide (SiC).

Figure 10:
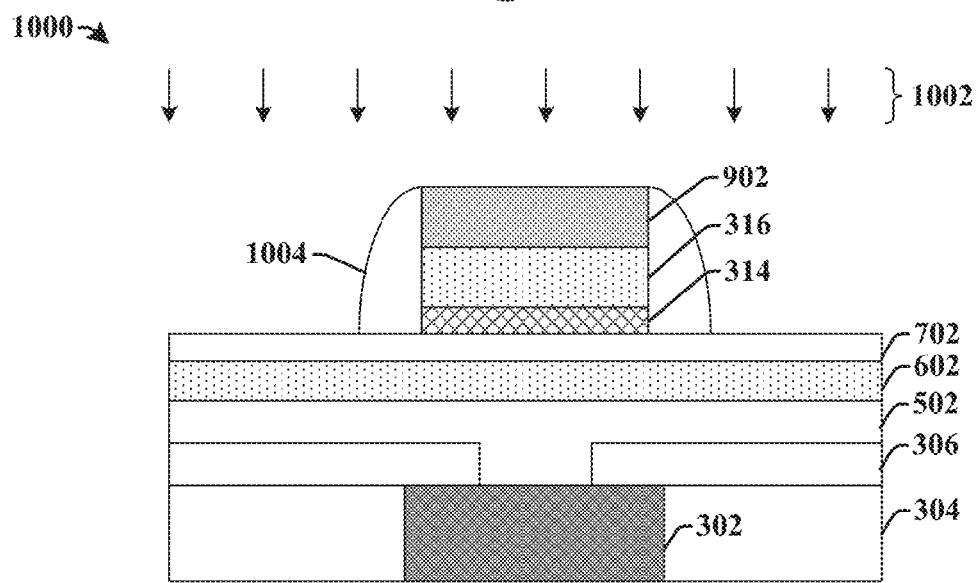

FIG. 10 illustrates some embodiments of a cross-sectional view corresponding to acts 418-420.

As shown in cross-sectional view 1000, a first patterning process is performed to pattern the top electrode layer 804 and the capping layer 802. The first patterning process selectively exposes the top electrode layer 804 and the capping layer 802 to an etchant 1002 in areas not covered by the masking layer 902, resulting in a top electrode 316 and a patterned capping layer 314. Sidewall spacers 1004 are then formed on opposing sides of the top electrode 316 and the patterned capping layer 1002. In some embodiments, the sidewall spacers 1004 may be formed by depositing nitride onto the dielectric data storage layer 702 and selectively etching the nitride to form the sidewall spacers 1004.

Figure 11:
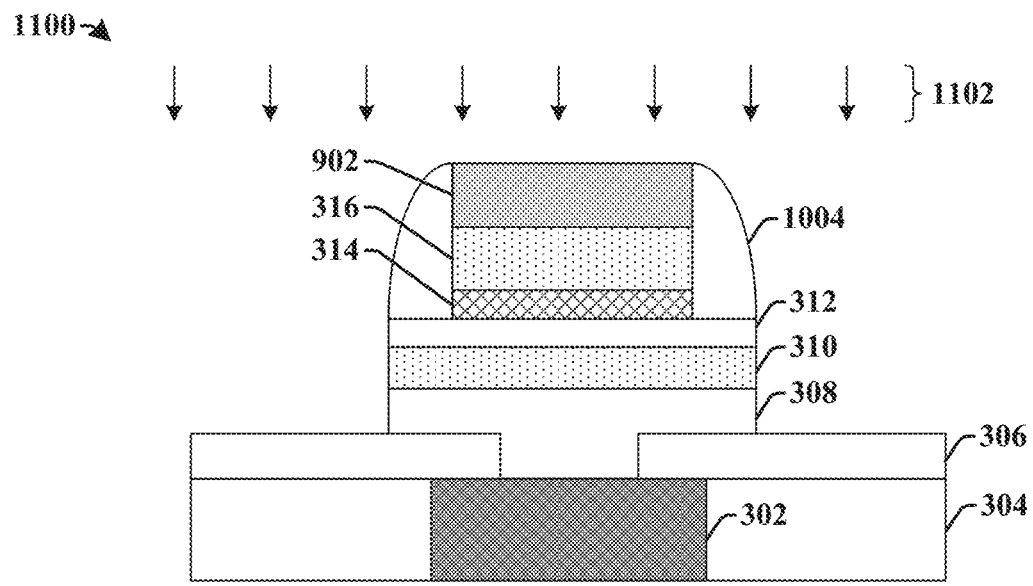

FIG. 11 illustrates a cross-sectional view 1100 of some embodiments corresponding to act 422.

As shown in cross-sectional view 1100, a second patterning process is performed to pattern the dielectric data storage layer 702, the bottom electrode layer 602, and the diffusion barrier layer 308. The second patterning process selectively exposes the dielectric data storage layer 702, the bottom electrode layer 602, and the diffusion barrier layer 308 to an etchant in areas not covered by the masking layer 902 or the sidewall spacers 1104, resulting in a patterned dielectric data storage layer 312, a bottom electrode, and a patterned diffusion barrier layer 308.

Figure 12:
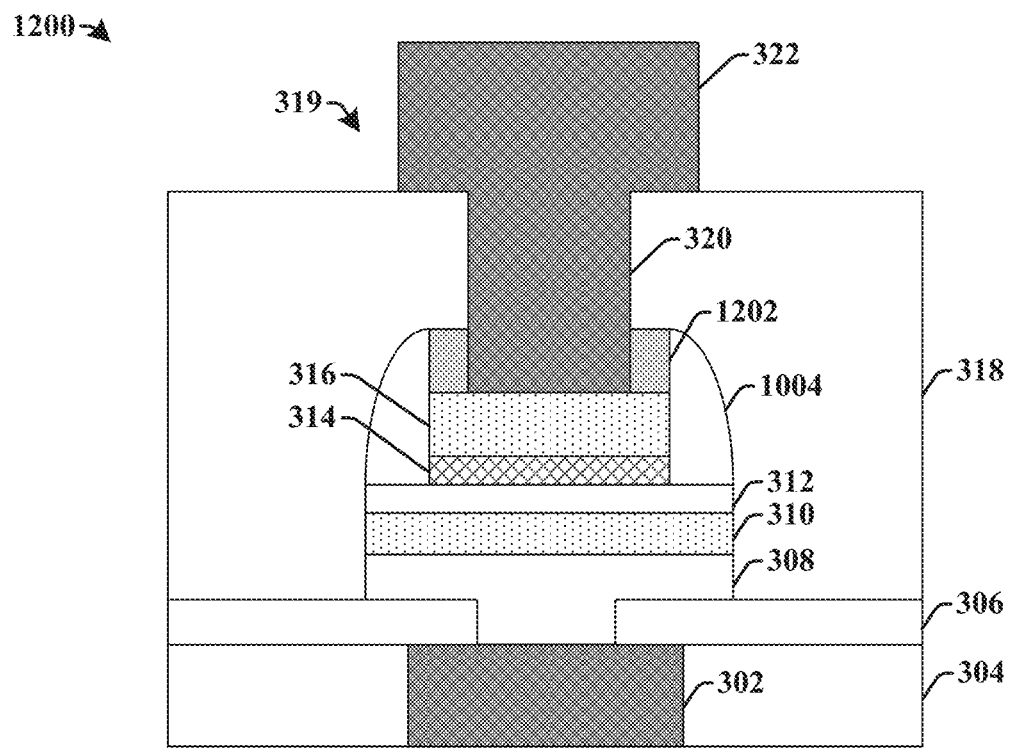

FIG. 12 illustrates a cross-sectional view 1200 of some embodiments corresponding to act 424.

As shown in cross-sectional view 1200 an upper metal interconnect layer 319 is formed over the top electrode 316. In some embodiments, the upper metal interconnect layer 319 may comprise an upper metal via layer 320 and an upper metal wire layer 322. In some embodiments, the upper metal interconnect layer 319 may be formed by depositing a dielectric layer 318 onto the RRAM memory cell. An etching process is then performed to form an opening that extends through the dielectric layer 318 and the hard mask layer 1202 to expose the top electrode 316. The opening is subsequently filled with a metal (e.g., copper, aluminum, etc.) to form the upper metal via layer 320 and an upper metal wire layer 322.

Therefore, the present disclosure relates to a method of forming a resistive random access memory (RRAM) cell having a low leakage current, using an ALD process to form a bottom electrode and an in-situ ALD process to form an overlying dielectric data storage layer.

In some embodiments, the present disclosure relates to a method of forming a resistive random access memory (RRAM) cell. The method is performed by forming a bottom electrode over a lower metal interconnect layer using an atomic layer deposition (ALD) process that forms at least a top portion of the bottom electrode and by forming a dielectric data storage layer having a variable resistance onto the top portion of the bottom electrode in-situ with forming the top portion of the bottom electrode. The method is performed by further forming a top electrode over the dielectric data storage layer, and forming an upper metal interconnect layer over the top electrode.

In other embodiments, the present disclosure relates to a method of forming a resistive random access memory (RRAM) cell. The method is performed by forming a bottom dielectric layer onto a lower metal interconnect layer surrounded by an inter-level dielectric (ILD) layer, and forming a diffusion barrier layer onto the lower metal interconnect layer and the bottom dielectric layer. The method is performed by further forming a bottom electrode onto the diffusion barrier layer using an atomic layer deposition (ALD) process that forms at least a top portion of the bottom electrode, and forming a dielectric data storage layer having a variable resistance onto the top portion of the bottom electrode in-situ with forming the top portion of the bottom electrode. The method is performed by further forming a capping layer onto the dielectric data storage layer, forming a top electrode onto the dielectric data storage layer, and forming an upper metal interconnect layer onto the top electrode.

In yet other embodiments, the present disclosure relates to a resistive random access memory (RRAM) memory cell. The RRAM cell has a bottom electrode disposed over a lower metal interconnect layer, and a dielectric data storage layer having a variable resistance located onto and in direct contact with the bottom electrode. The RRAM cell also has a top electrode disposed over the dielectric data storage layer, and an upper metal interconnect layer disposed onto the top electrode. The bottom electrode has an oxygen concentration of approximately 2.5% at an interface between the bottom electrode and the dielectric data storage layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a resistive random access memory (RRAM) cell, comprising:
   forming a bottom electrode over a lower metal interconnect layer using an atomic layer deposition (ALD) process that forms at least a top portion of the bottom electrode;
   forming a dielectric data storage layer having a variable resistance onto the top portion of the bottom electrode in-situ with forming the top portion of the bottom electrode;
   forming a top electrode over the dielectric data storage layer; and
   forming an upper metal interconnect layer over the top electrode.

2. The method of claim 1, wherein forming the bottom electrode comprises:
   depositing a first bottom electrode layer using a physical vapor deposition (PVD) process; and
   depositing a second bottom electrode layer onto and in direct contact with the first bottom electrode layer using the ALD process.

3. The method of claim 2, wherein the second bottom electrode layer has a thickness in a range of between approximately 15 angstroms and approximately 30 angstroms.

4. The method of claim 1, wherein the bottom electrode comprises titanium nitride (TiN).

5. The method of claim 4, wherein the dielectric data storage layer comprises hafnium oxide (HfOx).

6. The method of claim 1, wherein the ALD process comprises a plasma enhanced ALD (PEALD) process.

7. The method of claim 1, wherein the bottom electrode has an oxygen concentration of approximately 2.5% at an interface between the bottom electrode and the dielectric data storage layer.

8. The method of claim 1, wherein the dielectric data storage layer is formed using a separate atomic layer deposition (ALD) process.

9. The method of claim 1, wherein the dielectric data storage layer is configured to undergo a reversible change between a high resistance state and a low resistance state depending on a voltage applied to the bottom electrode or the top electrode.

10. A method of forming a resistive random access memory (RRAM) cell, comprising:
    forming a bottom dielectric layer onto a lower metal interconnect layer surrounded by an inter-level dielectric (ILD) layer;
    forming a diffusion barrier layer onto the lower metal interconnect layer and the bottom dielectric layer;
    forming a bottom electrode onto the diffusion barrier layer using an atomic layer deposition (ALD) process that forms at least a top portion of the bottom electrode;
    forming a dielectric data storage layer having a variable resistance onto the top portion of the bottom electrode in-situ with forming the top portion of the bottom electrode;
    forming a capping layer onto the dielectric data storage layer;

forming a top electrode onto the dielectric data storage layer; and forming an upper metal interconnect layer onto the top electrode.

11. The method of claim 10, wherein forming the bottom electrode comprises:

depositing a first bottom electrode layer using a physical vapor deposition (PVD) process; and depositing a second bottom electrode layer onto and in direct contact with the first bottom electrode layer using the ALD process.

12. The method of claim 11, wherein the second bottom electrode layer has a thickness in a range of between approximately 15 angstroms and approximately 30 angstroms.

13. The method of claim 10, wherein the bottom electrode comprises titanium nitride (TiN).

14. The method of claim 13, wherein the dielectric data storage layer comprises hafnium oxide (HfOx).

15. The method of claim 10, wherein the bottom electrode has an oxygen concentration of approximately 2.5% at an interface between the bottom electrode and the dielectric data storage layer.

16. The method of claim 10, wherein the dielectric data storage layer is configured to undergo a reversible change between a high resistance state and a low resistance state depending on a voltage applied to the bottom electrode or the top electrode.

17. A method of forming a resistive random access memory (RRAM) cell, comprising:

forming a bottom electrode over a lower metal interconnect layer, by using a physical vapor deposition (PVD) process to form a lower portion of the bottom electrode and an in-situ plasma enhanced atomic layer deposition (PEALD) process to form an overlying upper portion of the bottom electrode;

forming a dielectric data storage layer having a variable resistance onto the upper portion of the bottom electrode in-situ with forming the bottom electrode;

forming a top electrode over the dielectric data storage layer; and forming an upper metal interconnect layer over the top electrode.

18. The method of claim 17, wherein the lower portion and the upper portion of the bottom electrode have outermost sidewalls that are aligned with outermost sidewalls of the dielectric data storage layer.

19. The method of claim 17, wherein the lower portion of the bottom electrode has a greater thickness than the upper portion of the bottom electrode.

20. The method of claim 17, wherein the lower portion and the upper portion of the bottom electrode have outermost sidewalls that are aligned.

* * * * *